United States Patent [19]

Rempt

[11] Patent Number: 4,814,706

[45] Date of Patent: Mar. 21, 1989

[54] FIBER-OPTIC MAGNETIC FIELD GRADIOMETER FOR FIRST, SECOND AND HIGHER ORDER DERIVATIVES

[75] Inventor: Raymond D. Rempt, Woodinville, Wash.

[73] Assignee: The Boeing Company, Seattle, Wash.

[21] Appl. No.: 169,802

[22] Filed: Mar. 18, 1988

Related U.S. Application Data

[63] Continuation-in-part of Ser. No. 22,681, Mar. 6, 1987, abandoned.

[51] Int. Cl.[4] ............... G01R 33/022; G01R 33/023; G01B 9/02
[52] U.S. Cl. .................. 324/244; 324/260; 350/96.29; 250/227; 356/345
[58] Field of Search .......... 324/96, 244, 260; 350/96.29; 356/345; 250/227, 231 R

[56]  References Cited

U.S. PATENT DOCUMENTS

| | | | |
|---|---|---|---|
| 2,485,931 | 10/1949 | Slonczewski | 324/247 |
| 4,112,367 | 9/1978 | Hepner et al. | 324/244 |
| 4,147,979 | 4/1979 | Baues et al. | 324/244 |
| 4,356,448 | 10/1982 | Brogardh | 324/244 |
| 4,376,248 | 3/1983 | Giallorenzi et al. | 250/227 |
| 4,378,497 | 3/1983 | Giallorenzi | 250/227 |
| 4,432,599 | 2/1984 | McMahon | 250/227 |
| 4,442,350 | 4/1984 | Rashleigh | 250/227 |
| 4,450,406 | 5/1984 | Bobb | 324/244 |
| 4,477,723 | 10/1984 | Carome et al. | 250/227 |
| 4,524,322 | 6/1985 | Bobb | 324/96 |
| 4,591,786 | 5/1986 | Koo et al. | 324/244 |

OTHER PUBLICATIONS

Koo et al., "A Fiber-Optic Magnetic Gradiometer", Journal of Light-Wave Technology, LT-1, No. 3, 9/1983, pp. 509-513.

*Primary Examiner*—Reinhard J. Eisenzopf
*Assistant Examiner*—Walter E. Snow
*Attorney, Agent, or Firm*—Foley & Lardner, Schwartz, Jeffery, Schwaab, Mack, Blumenthal & Evans

[57] ABSTRACT

A fiber-optic magnetic field gradiometer uses the second derivative of a magnetic field to determine the location of a ferromagnetic object located in an array of objects. Three adjacent magnetic transducers made of several layers of magnetostrictive glass are wrapped with an optical fiber and immersed in an applied magnetic field to null out material differences and the earth's magnetic field. The null conditions for each adjacent pair are accomplished without disturbing the null conditions of the other adjacent pair. A magnetic field to be detected along the axes of the magnetic transducers causes an optical path length change in the fibers. The overall path length change is proportional to the second derivative of the magnetic field.

22 Claims, 4 Drawing Sheets

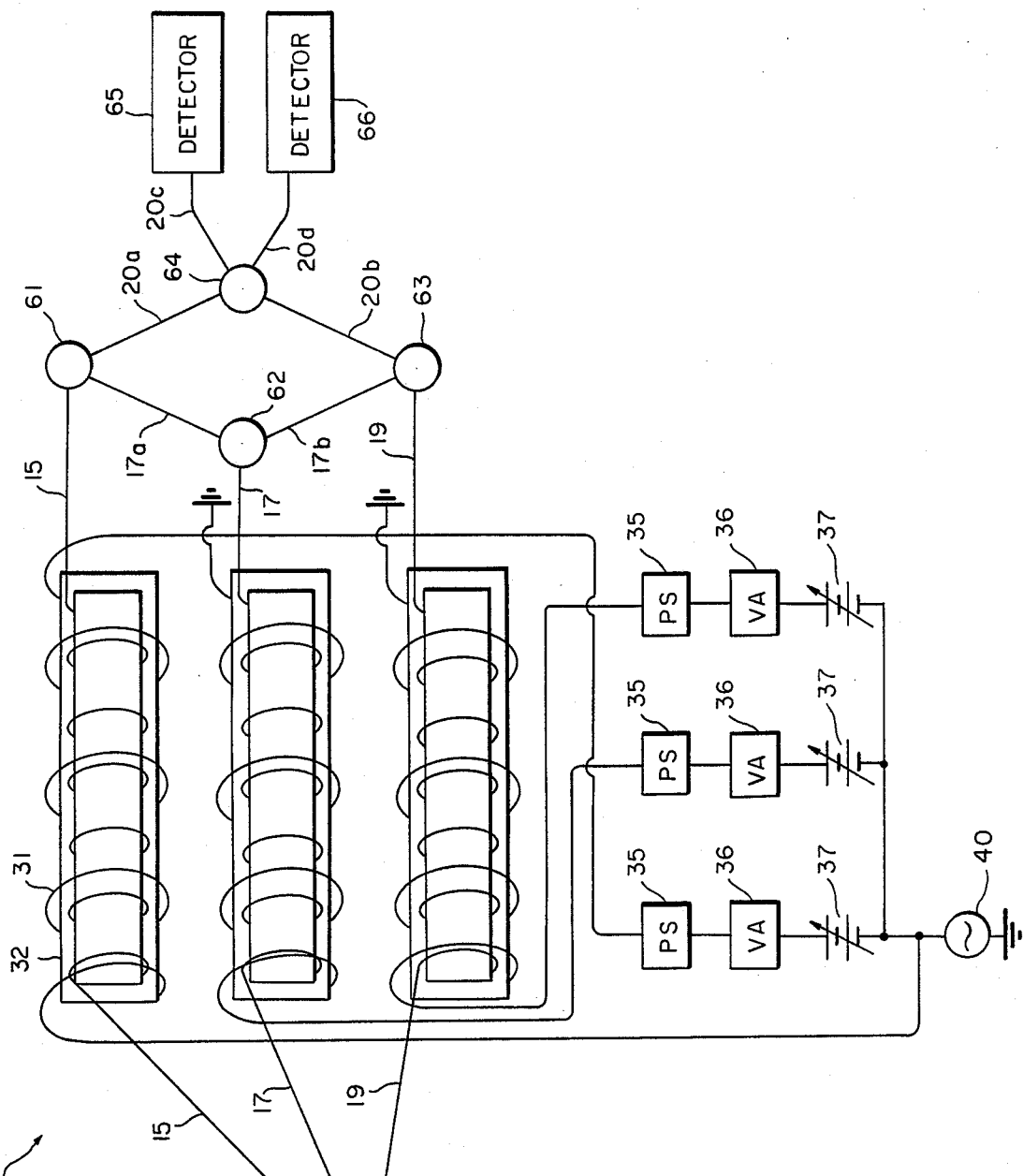

FIBER-OPTIC MAGNETIC FIELD GRADIOMETER FOR FIRST, SECOND AND HIGHER ORDER DERIVATIVES

CROSS-REFERENCE TO RELATED APPLICATION

This invention is a continuation-in-part of application Ser. No. 022,681, filed Mar. 6, 1987, now abandoned.

BACKGROUND OF THE INVENTION

This invention relates generally to magnetic field gradiometers and in particular to a fiber-optic magnetic field gradiometer for measuring first, second, and higher order derivatives.

In the detection, identification and location of tactical and strategic targets such as trucks, mines and submarines, one of the most difficult signatures to hide is the magnetic one. Even when visible methods are fogged over or radar methods are jammed, the magnetic signature indicating the existence and location of the targets still exists. Of particular interest is the location of targets whose exact position is unknown. Ferromagnetic hardware such as tanks and trucks on the ground, and submarines and mines under the water disturb the local geomagnetic field. These disturbances, or magnetic anomalies, are detectable as changes in the magnetic field measured as a sensor flies over them. For this reason, a sensor measuring the field changes or gradient provides more useful information than one merely measuring the field itself.

Present state-of-the-art for magnetic anomaly detection employs super-conducting quantum interference devices (SQUIDS) or proton precession devices. The latter devices do not have sufficient sensitivity to detect smaller targets such as trucks at sufficient range (1/2 kilometer) as a sensor flies over them, and require laborious calibration procedures. The former devices have a high resolution but, due to their superconducting nature, require large bulky devices for cooling.

K. P. Koo and G. H. Sigel, Jr. in "A Fiber-Optic Magnetic Gradiometer," (Journal of Light Wave Technology. Vol. Lt-1, No. 3, September 1983) disclose a fiber-optic gradiometer capable of measuring both AC and DC magnetic field gradients and is incorporated herein by reference. The concepts disclosed are shown graphically in FIGS. 1-3. FIG. 1 shows the flight trajectory of a magnetic field gradiometer as it flies at a height Z of 100 meters over three 1-meter radius iron spheres 1, 2 and 3 located on the X-axis at −75, 0 and 75 meters, respectively. FIG. 2 shows a graph of the magnetic field disturbances along the X-axis caused by spheres 1, 2 and 3 with the circles 1a, 2a and 3a indicating the respective spheres. FIG. 3 shows a graph of the first derivative or the magnetic field gradient of the magnetic field with spheres 1, 2 and 3 again indicated by circles 1a, 2a and 3a, respectively. However, as can be seen in FIGS. 1-3, no information on the location of the individual spheres in the array can be derived from the teachings of the prior art.

Accordingly, it is an object of the present invention to provide a method and apparatus capable of accurately determining location of a target.

It is a further object of the invention to provide an apparatus that is small and lightweight.

Other objects and advantages of the invention will become more apparent hereinafter in reference to the detailed description of the preferred embodiments and drawings.

BRIEF SUMMARY OF THE INVENTION

Three magnetic transducers are each wrapped with a single mode optical fiber. The fibers are so attached to the transducers that good coupling results when any of the transducers is subjected to a magnetic field of magnitude which is desired to be detected. Each of the transducers along with their respective fibers are immersed in an applied magnetic field to balance out material differences and the earth's magnetic field, and to establish an appropriate bias field level. Light from a laser is then launched into the three single mode optical fibers and recoupled after passing through the fibers as pairs between the first and second transducer at a first coupler, and between the second and the third transducer at a second coupler. A magnetic field along the sensitive axes of the transducer causes the magnetostrictive glass to expand or contract, thereby changing the length of the fiber affixed to it and hence changing the optical path length. The output of the first coupler is then coupled with the output of the second coupler to determine the overall path length change which is proportional to the second derivative of the magnetic field.

BRIEF DESCRIPTION OF THE DRAWINGS

FIG. 6 is a cross-sectional view of a cylinder made of a magnetostrictive glass as taken along line 6—6 of FIG. 5.

FIG. 7 is a schematic view of the magnetic field gradiometer according to a second embodiment of the invention.

DETAILED DESCRIPTION OF THE PREFERRED EMBODIMENTS

Figure 3:
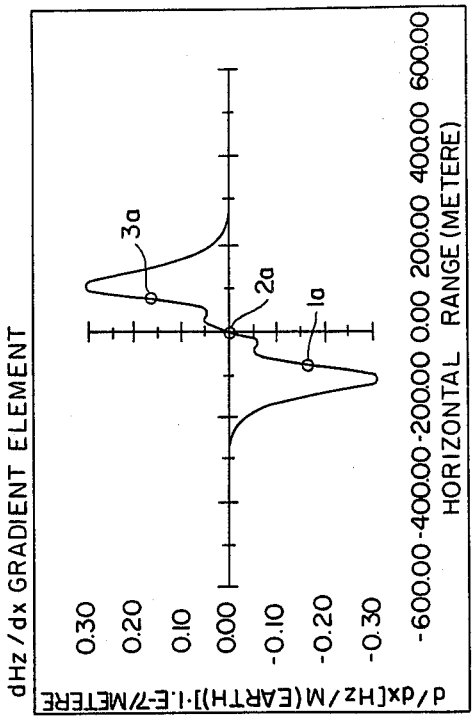
FIG. 3 is a graph of the first derivative of the magnetic field of FIG. 2.
Figure 4:
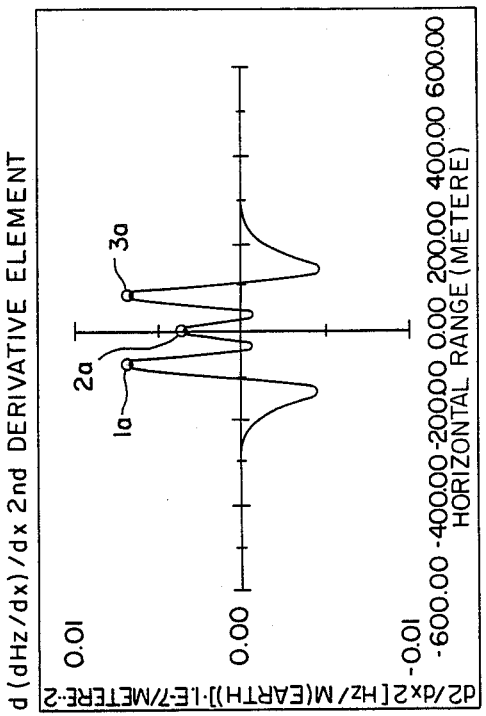
FIG. 4 is a graph of the second derivative of the magnetic field of FIG. 2 showing the location of the three 1-meter radius spheres.
Figure 1:
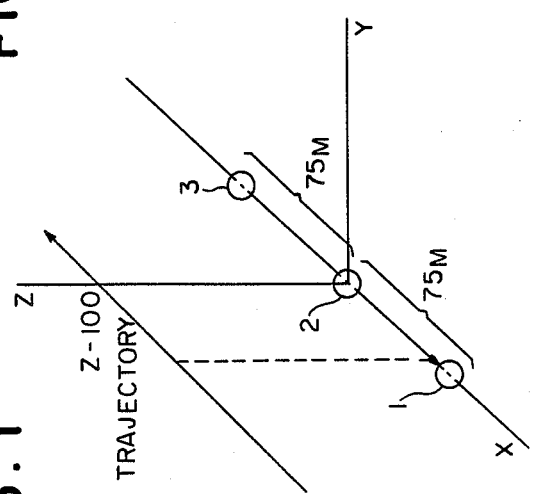
FIG. 1 is a graphical representation of a flight trajectory of a magnetic field gradiometer over three 1-meter radius spheres.
Figure 2:
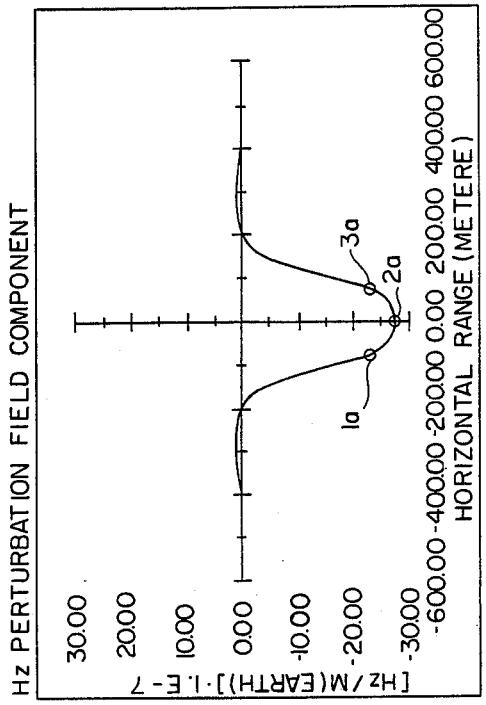
FIG. 2 is a graph of the magnetic field along the flight trajectory of FIG. 1.

For an array of targets, such as a fleet of trucks, the second derivative or gradient of the gradient of the magnetic field in the vicinity of the targets allows individual targets in the array to be located. Referring now to FIG. 4 in addition to FIGS. 1-3, the importance of measuring the second derivative may readily be appreciated. The peaks of the second derivative of the magnetic field as seen in FIG. 4 at locations 1a, 2a and 3a give the location of the spheres 1, 2 and 3, respectively. Thus, obtaining the second derivative of a magnetic field provides the ability to pinpoint target location when there are several targets in the array.

Figure 5:
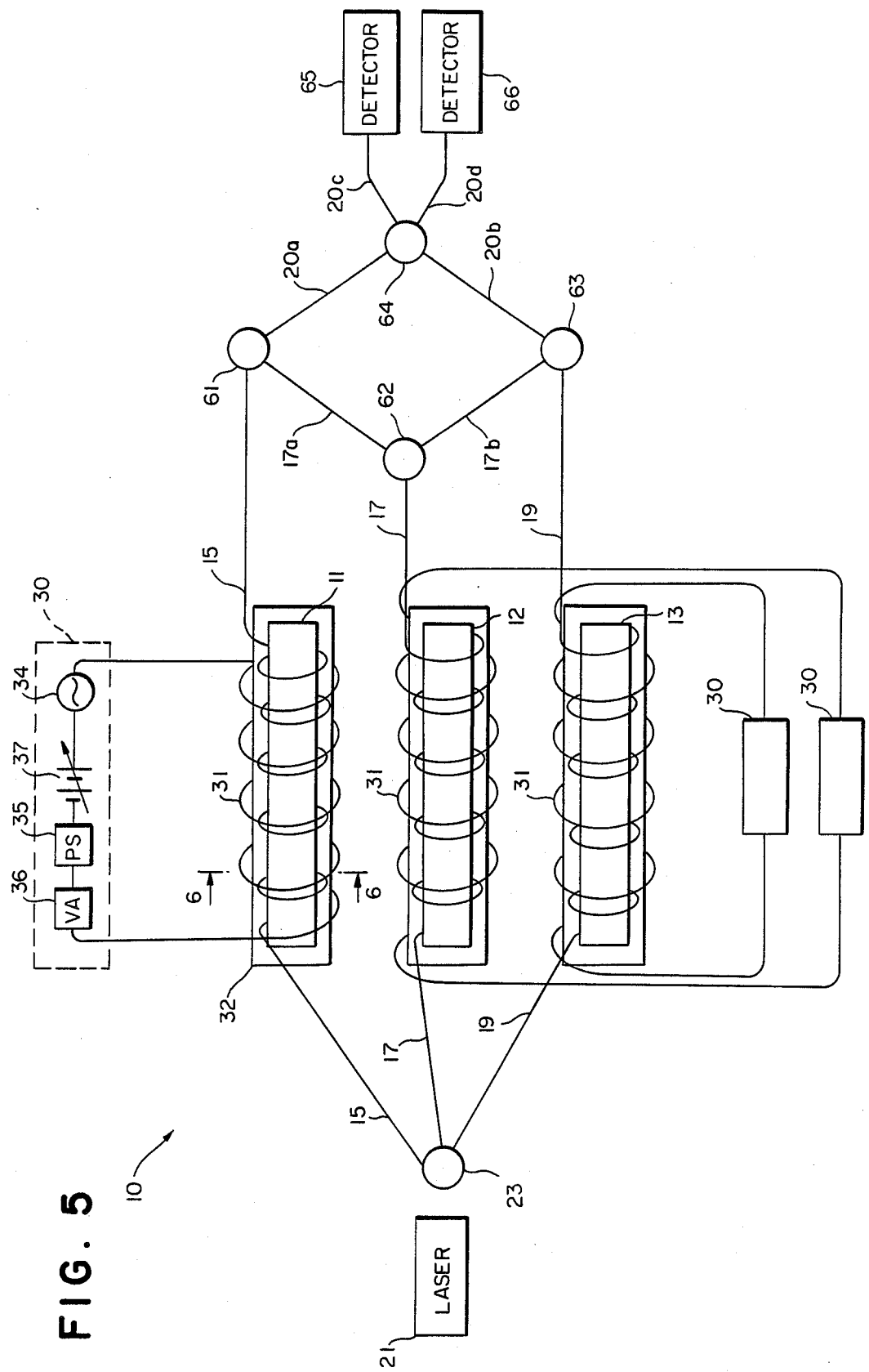
FIG. 5 is a schematic view of the magnetic field gradiometer according to a first embodiment of the invention.

Referring now more particularly to the preferred embodiment of the invention selected for illustration, the magnetic field gradiometer according to the present invention and generally designated by reference numeral 10 is shown in FIG. 5. The gradiometer 10 is constructed using three magnetic transducers each of which has a magnetically sensitive axis which is oriented along the field direction for which it is desired to measure the second derivative. In a first embodiment, these three transducers are in the form of cylinders 11, 12 and 13 which are made of thin layers of magnetostrictive glass 14 sufficient to form a cylinder. These layers 14 are typically on the order of 0.001 inches thick. The overall wall thickness of the cylinders is typically 0.001-0.01 inches. FIG. 6 illustrates a cross-section of cylinder 11 showing the layers of glass 14. The cylinders 12 and 13 are of a similar construction. Over the glass 14 for each cylinder 11, 12 and 13 are wrapped single mode optical fibers 15, 17 and 19, respectively. The fibers are so attached to the glass 14 such that good coupling results when any of the cylinders 11, 12 or 13 is subjected to a magnetic field of magnitude which is desired to be detected. The cylinders are parallel and adjacent to each other such that the central axis, i.e., the magnetically sensitive axis, of each cylinder lies in the same plane. Furthermore, the distances between the central axes of each adjacent cylinder pair are equal.

Each of the cylinders 11, 12 and 13 along with their respective fibers 15, 17 and 19 are immersed in an applied magnetic field to balance out material differences and the earth's magnetic field, and provide an appropriate bias field to ensure that the magnetostrictive strain is quadratic in field strength. One of the possible circuit connections is shown in FIG. 5. An applied magnetic field circuit 30 provides an AC and DC bias field to each cylinder 11, 12 and 13 via a coil 31 wrapped around a non-ferromagnetic tube 32 as shown for cylinder 11 in FIG. 6. Tube 32 and spacers 33 are typically constructed of glass or cardboard. Coil 31 is wrapped around tube 32 with sufficient turns to provide easy control of the applied magnetic field of appropriate magnitude. This aforementioned structure is repeated for cylinders 12 and 13. A generator 34 of frequency $\omega$ provides the AC portion of a bias field in each circuit 30. Each circuit 30 is equipped with a phase shifter 35 and a variable attenuator 36 so that each circuit 30 may be independently adjusted for amplitude and phase. In addition, a static DC magnetic field may be applied by adjusting the magnitude of the voltage at the DC supply 37 contained in each circuit 30. The DC magnetic biases are applied to compensate for any material response differences and to null off the earth's magnetic field, and to provide the appropriate bias field to ensure that the magnetostriction is quadratic in field strength. The AC field is used to upconvert a DC signal of interest to a convenient frequency well away from the effects of noise at extremely low frequencies. Since the frequency must be the same for each AC bias field, an alternative circuit connection is shown in FIG. 7 where only one generator 40 is used. The advantage of this circuit connection is that only one generator need be set to the frequency $\omega$. In practice, each bias coil is energized by AC and DC, which are summed by an operational amplifier and then fed to the respective coils.

After being wrapped around their respective cylinders, optical fibers 15, 17 and 19 are coupled together to provide the requisite interferences as shown in FIGS. 5 or 7. Coupler 62 is provided to split the optical fiber 17 into a first and second optical fiber branch. The first branch 17a is fed to a coupler 61 together with optical fiber 15 wherein the laser radiation is coupled to an optical fiber 20a. The second branch 17b is fed to a coupler 63 together with optical fiber 19 wherein the laser radiation is coupled to an optical fiber 20b. Optical fibers 20a and 20b are coupled in coupler 64 to optical fibers 20c and 20d which are positioned to have laser radiation emanating therefrom to fall on detectors 65 and 66.

In operation, light from a laser 21 is launched through a coupler 23 into the three single mode fibers 15, 17 and 19 and recoupled after passing through the fibers on the cylinders, as pairs, between cylinders 11 and 12 at coupler 61 and cylinders 12 and 13 at coupler 63. A coupler 62 is used to split the optical signal from fiber 17 in order to allow the signal to be shared by couplers 61 and 63. The effective optical path length of fibers 15, 1 and 19 must be equal assuming a uniform magnetic field. Therefore, the length of fibers 15 and 19 must be equal. In addition, the effective length of fiber 17 from coupler 23 to coupler 61 must be equal to the length of fiber 15 from coupler 23 to coupler 61. Similarly, the effective length of fiber 17 from coupler 23 to coupler 63 must be equal to the effective length fiber 19 from coupler 23 to coupler 63.

The upper two cylinders 11 and 12 having fibers 15 and 17 recoupled at coupler 61 comprise a Mach-Zender interferometer with both fibers 15 and 17 operating as measurement arms. Similarly, cylinders 12 and 13 in cooperation with fibers 17 and 19 recoupled at coupler 63 comprise another Mach-Zender interferometer. Each of the two interferometers (terminating at couplers 61 and 63) are held at quadrature by standard means, for example, like that described by D. A. Jackson, R. Priest, A. Dandridge, and A. B. Tveten, Applied Optics Volume 19, pp 2926–2929, September 1980, incorporated herein by reference. Furthermore, the detectors 65 and 66 provide active stabilization in order to maintain the gradiometer in quadrature. By maintaining quadrature, the gradiometer is not affected by random phase drift due to small environmental changes and the phase of the interference signal emanating from the coupler 64 is locked. Note that the output of the gradiometer may be determined by either detector 65 or 66, and since the gradiometer is maintained at quadrature, the signal does not vanish.

Considering, for the moment, only the upper two cylinders 11 and 12, note that the total field is common mode rejected resulting in no path length change at coupler 61 when there is no field variation, and only if the field is different between the location of cylinders 11 and 12 will there be a path length change. The change may be detected if a null condition is initially achieved during set-up or calibration so as to compensate for small differences in the effective coupling of the fibers to the magnetostrictive glass at each cylinder. A magnetic field along the axes of cylinders 11 and 12 causes the magnetostrictive glass 14 to expand or contract thereby changing the effective length of the fibers 15 and 17 affixed to the magnetostrictive glass 14, and hence changing the optical path length between the two fibers 15 and 17. An increase in the magnetic field along the axis of the cylinder causes the cylinder to stretch, thereby contracting the magnetostrictive glass and the optical fiber attached thereto. Conversely, a decrease in the magnetic field along the axis causes the cylinder to contract, thereby expanding the magnetostrictive glass and the optical fiber attached thereto. With appropriate field biasing, this path length change is quadratic in the magnetic field. For the two fibers 15 and 17, the change in path length is given by $$\Delta L_{1,2} = L_1 C H_1^2 - L_2 K H_2^2$$

where
 $L_1, L_2$ = length of fibers 15 and 17, respectively
 $H_1, H_2$ = magnetic field at cylinders 11 and respectively, and
 C, K are material constants referring to the coupling of fibers 15 and 17 to the magnetostrictive glass 14.

Then, assuming the bias circuits for cylinders 11 and supply DC bias fields of $H_1^{dc}$ and $H_2^{dc}$ respectively, and AC bias fields of $H_1^{ac}$ and $H_2^{ac}$ respectively at frequency $\omega$, and $H_{10}$ is the geomagnetic field at cylinder 11 and $H_{20}$ that at cylinder 12, and the DC field to be measured is $H_{ext}^{dc}$ and the AC field to be measured $H_{ext}^{ac}$, one obtains $$H_1 = H_1^{dc} + H_{ext}^{dc} + H_1^{ac} + H_{ext}^{ac}$$

and $$H_2 = H_2^{dc} + H_{20} + H_{ext}^{ac} + \Delta H_{1,2ext}^{dc} + H_2^{ac} + H_{ext}^{ac} \Delta H_{1,2ext}^{ac},$$

where $\Delta H_{1,2ext}^{dc}$ and $\Delta H_{1,2ext}^{ac}$ are the DC and AC gradients of the field to be measured between cylinders 11 and 12.

The expression for $\Delta L_{1,2}$ now becomes $$\Delta L_{1,2} = L_1 C \{H_1^{dc} + H_{10} + H_{ext}^{dc} + H_1^{ac} + H_{ext}^{ac}\}^2 -$$
$$L_2 K \{H_2^{dc} + H_{20} + H_{ext}^{dc} + \Delta H_{1,2ext}^{dc} + H_2^{ac} + H_{ext}^{ac} + \Delta H_{1,2ext}^{ac}\}^2.$$

Expanding and collecting only those terms at frequency $\omega$, $$\Delta L_{1,2}\Big|_{\omega} = 2\{L_1 C(H_1^{dc} + H_{10})H_1^{ac} - L_2 K(H_2^{dc} + H_{20})H_2^{ac}\} +$$
$$2\{(L_1 C H_1^{ac} - L_2 K H_2^{ac})\}H_{ext}^{dc} - 2L_2 K H_2^{ac}\Delta H_{1,2ext}^{dc}$$

and if the frequency of the external field to be measured is $\omega_{ee}$, then the terms at the mixed frequency $\omega, \pm\omega_e$ are $$\Delta L_{1,2}\Big|_{\omega\pm\omega_e} = 2(L_1 C H_1^{ac} - L_2 K H_2^{ac})H_{ext}^{ac} - 2L_2 K H_2^{ac}\Delta H_{1,2ext}^{ac}$$

As pointed out by the above cited Koo et al reference, if balance conditions are set such that $$L_1 C H_1^{ac} - L_2 K H_2^{ac} = 0$$

and $$H_2^{dc} + H_{20} = 0$$

and $H_1^{dc} + H_{10} = 0$, then the following results are obtained:

$$\Delta L_{1,2}\Big|_{\omega} = -2L_2 K H_2^{ac}\Delta H_{1,2ext}^{dc}$$

and $$\Delta L_{1,2}\Big|_{\omega\pm\omega_e} = -2L_2 K H_2^{ac}\Delta H_{1,2ext}^{ac}$$

Therefore, at balance, the remaining signal at frequency $\omega$ is dependent only on the gradient of the DC external field and the remaining signal at the mixed frequencies $\omega, \omega_e$ is dependent only on the AC external field gradient. At balance, then, the field gradient between cylinders 11 and 12 appears at the output of coupler 61 and is per se known in the prior art as reflected by the aforementioned Koo et al article. The present invention is an improvement over the prior art yielding a signal proportional to the second derivative of the field thereby indicating position in an array as shown in FIG. 4 when a magnetic field gradiometer of the present invention flies along the trajectory shown in FIG. 1. In addition, the concept of the present invention described hereinbelow may be applied any number of times to yield third and higher order derivatives with each successive step involving addition of more interferometer arms. Considering now fibers 17 and 19 joined at coupler 63, a similar formulation may be undertaken to detect the field gradient between cylinders 12 and 13.

The balance conditions are, for this case, $$L_2 H_2^{ac} - L_3 D H_3^{ac} = 0$$

$$H_2^{dc} + H_{20} = 0$$

$$H_3^{dc} + H_{30} = 0$$

where $L_3$ is the length of the fiber 19 on cylinder 13, D is the material constant for the fiber/glass configuration on cylinder 13 and $H_3^{ac}$ and $H_3^{dc}$ are the bias fields applied to cylinder 13 via the circuitry, and $H_{30}$ the geomagnetic field at cylinder 13. It has been found that balance may surprisingly be achieved by only adjusting $H_3^{ac}$ and $H_3^{dc}$, thereby not disturbing the existing null condition between cylinders 11 and 12.

Under the balance condition then, $$\Delta L_{2,3}\Big|_{\omega} = -2L_3 D H_3^{ac}\Delta H_{2,3ext}^{dc}$$

where $\Delta H_{2,3ext}^{dc}$ is the DC field gradient between cylinders 12 and 13; and $$\Delta L_{2,3}\Big|_{\omega\pm\omega_e} = -2L_3 D H_3^{ac}\Delta H_{2,3ext}^{ac}$$

where $\Delta H_{2,3ext}^{ac}$ is the corresponding AC field gradient.

If the outputs from couplers 61 and 63 are then coupled at coupler 64, the total path length change $\Delta L_T$ as detected by detector 65 or 66 is given by $$\Delta L_T\Big|_{\omega} = \Delta L_{1,2} - \Delta L_{2,3} = -2L_2 K H_2^{ac}\Delta H_{1,2ext}^{dc} +$$
$$2L_3 D H_3^{ac}\Delta H_{2,3ext}^{dc}$$

But from the balance condition, $L_2 K H_2^{ac} = L_3 D H_3^{ac}$, so $\Delta L_T$ becomes $$\Delta L_T\Big|_{\omega} = 2L_3 D H_3^{ac}[\Delta H_{2,3ext}^{dc} - \Delta H_{1,2ext}^{dc}].$$

The term in brackets is the difference in the two DC gradients, which is proportional to the second derivative. Similarly, at the mixed frequencies $\omega, \omega_e$, we have $$\Delta L_T\big|_{\omega\pm\omega_e} = 2L_3 DH_3^{qc}[\Delta H_{2,3ext}^{qc} - \Delta H_{1,2ext}^{qc}]$$

where the bracketed term is proportional to the AC second derivative. Thus, under balance conditions for two separate gradiometers involving three cylinders, coupling of the two output signals from couplers 61 and 63 via coupler 64 as measured by detectors 65 or 66 yields signals proportional to the DC second derivative at the applied bias frequency and proportional to the AC second derivative at the mixed frequencies. The detectors 65 and 66 may comprise a conventional silicon p-i-n diode coupled to a frequency analyzer, or other appropriate signal processing electronics. The concept may be extended further by additional compounding to yield third and higher order derivatives.

Figure 8:
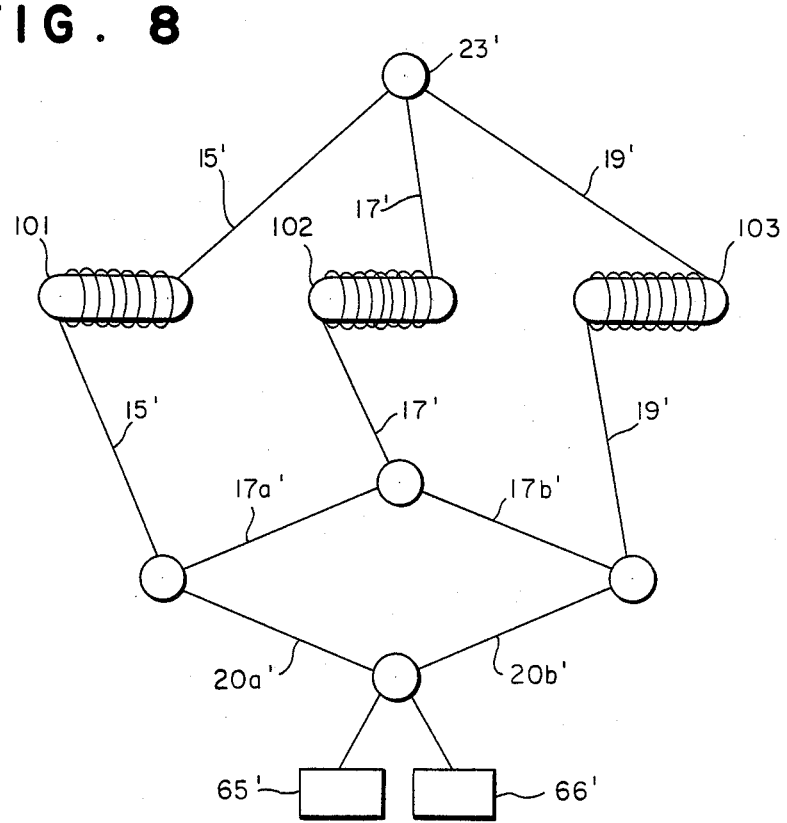
FIG. 8 is a diagramatic representation of a third embodiment of the invention.

A third embodiment of the invention is illustrated in FIG. 8. First, second and third magnetic transducers 101, 102 and 103, respectively, are aligned in a straight line, e.g., each has its magnetically sensitive axes coincident with one another. The magnetic transducer may comprise a cylinder having magnetostrictive layers rolled together as shown in FIG. 6 or alternately as described below in connection with FIG. 9. The electrical connection of as shown in FIG. 5 or 7. Further the optical coupling of the surrounding single mode fibers may also be achieved using the configuration of FIGS. 5 or 7. The optical elements illustrated in FIG. 8 utilize primed numbers corresponding to the designations of FIG. 7. In practice, the only difference between the arrangement shown in FIGS. 5 and 7 and the arrangement of FIG. 8 is the orientation of the magnetic transducers in a straight line rather than adjacent and parallel to each other as in FIGS. 5 and 7.

Figure 9:
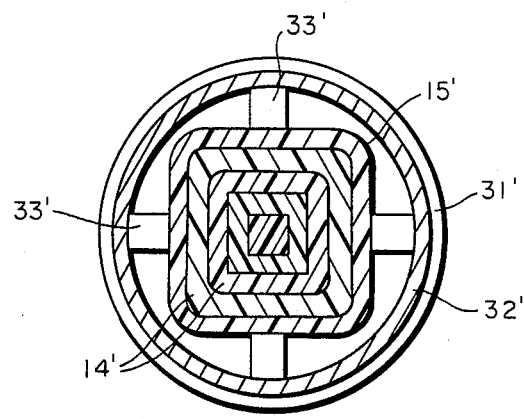
FIG. 9 is a cross-sectional view of a fourth embodiment of the invention.

FIG. 9 is a cross-sectional view similar to that of FIG. 6 but illustrating a fourth embodiment of the invention. In FIG. 6, primed reference numerals are used for the corresponding unprimed elements of FIG. 6. The basic difference between FIGS. 9 and 6 is that the cylindrical configuration of the magnetostrictive materials of FIG. 6 are replaced with a more square cross-sectional configuration, with corners not going below the minimum bending radius of the fibers. The invention is, however, not limited to either circular or square cross-sectional geometries as other shapes may also be employed.

The advantages of the present invention are numerous. It will find great utility as a small, light-weight magnetic field gradiometer capable of determining position of a ferromagnetic object in an array of objects by measuring the second derivative of the magnetic field along the direction of the axes of the cylinders. An additional advantage is the ease of calibration. Only Helmholtz coils are required and no zero field chamber is necessary to perform the calibration. Furthermore, the present invention provides for the balancing of the third cylinder to achieve null conditions without disturbing the null conditions of the other two cylinders. Finally, balancing of the sensor may be done remotely.

Thus, although the invention has been described relative to specific embodiments thereof, it is not so limited and numerous variations and modifications thereof will be readily apparent to those skilled in the art in light of the above teaching. It is therefore to be understood that within the scope of the appended claims, the invention may be practiced otherwise than as specifically described.

What is claimed is:

1. A magnetic field gradiometer comprising:
    at least a first, second and third magnetic transducer;
    at least three optical fibers, one fiber wrapped around each of said magnetic transducers wherein said fibers define at least three optical paths;
    a laser means coupled to said fibers to provide laser light within said fibers wherein the laser light travels along the optical paths defined by said fibers;
    an applied magnetic field generating means for immersing each of said magnetic transducers in an applied magnetic field having an AC and a DC component; and
    first means operative when said fibers are subjected to an external magnetic field to be measured for detecting a change in the length $\Delta L_{1,2}$ of the optical paths defined by said fibers between said first and second magnetic transducers and the change in length $\Delta L_{2,3}$ of the optical paths defined by the fibers between the second and third magnetic transducers, and second means for detecting a total length change $\Delta L_T$ proportional to $|\Delta L_{1,2} - \Delta L_{2,3}|$ of said fibers wherein said total change in length $\Delta L_T$ of the optical paths provides an indication of the second derivative of said external magnetic field.

2. A magnetic field gradiometer as claimed in claim wherein said first, second and third magnetic transducers comprises a first, second and third cylinder, and first, second and third fibers wrapped on said first, second and third cylinders, respectively, said first and second cylinders being adjacent one another and said second and third cylinders being adjacent one another.

3. A magnetic field gradiometer as claimed in claim 1, wherein said magnetic transducers each have a magnetically sensitive axis and said axes are aligned adjacent and parallel to each other and in the same plane.

4. A magnetic field gradiometer as claimed in claim 1, wherein said magnetic transducers each have a magnetically sensitive axis and each of said axes are aligned along a common axis.

5. A magnetic field gradiometer as claimed in claim 1, wherein said first means for detecting a change in the length $\Delta L_{1,2}$ and $\Delta L_{2,3}$ comprises:
    a first optical coup for coupling said first and second optical fibers to a fourth optical fiber;
    a second optical coupler for coupling said second and third optical fibers to a fifth optical fiber; and wherein said third means for detecting the total length change $\Delta L_T$ comprises:
    a third optical coupler for coupling said fourth and fifth optical fibers to sixth and seventh optical fibers; and
    detector means for converting laser light output from said sixth and seventh optical fibers into an electrical signal indicative of said magnetic field second derivative.

6. A magnetic field gradiometer as claimed in claim 5, wherein said first through seventh optical fibers are single mode fibers.

7. A magnetic field gradiometer as claimed in claim 6, further comprising an additional coupler splitting said second optical fiber into first and second branches, a first branch connected to said first optical coupler serving as said second optical fiber and said second branch coupled to said second optical coupler serving as said second optical fiber.

8. A magnetic field gradiometer as claimed in claim 1, wherein said applied magnetic field generating means comprises means for independently adjusting said AC and DC components for each of said cylinders.

9. A magnetic field gradiometer as claimed in claim 1, wherein said applied magnetic field generating means comprises means for independently adjusting an amplitude and phase characteristic of said AC component and an magnitude characteristic of said DC component for each of said cylinders.

10. A magnetic field gradiometer as claimed in claim 3, wherein the distance between any two adjacent central axes is the same as any other two adjacent central axes.

11. A magnetic field gradiometer as claimed in claim 2, wherein the distance between said first and second cylinders is equal to the distance between said second and third cylinders.

12. A magnetic field gradiometer as claimed in claim 8, wherein said AC and DC adjusting means are operable for nulling effects due to differences in materials, nulling the earth's magnetic field, and for establishing an appropriate bias field when said gradiometer is not subjected to said external magnetic field to be measured wherein each of said optical paths are of equal length.

13. A magnetic field gradiometer as claimed in claim 1, wherein each of said optical fibers is a single mode fiber.

14. A magnetic field gradiometer as claimed in claim 8, wherein each of said optical fibers is a single mode fiber.

15. A magnetic field gradiometer as claimed in claim 12, wherein each of said optical fibers is a single mode fiber.

16. A magnetic field gradiometer as claimed in claim 2, wherein said detecting means comprises a detector coupled to signal processing electronics.

17. A method of detecting a second derivative of an external magnetic field comprising the steps of:
(a) orienting a magnetically sensitive axis of a first second and third magnetic transducer along a given field direction for which the second derivative of the external magnetic field is desired to be measured, said magnetic transducers wrapped with a first, second and third optical fiber, respectively;
(b) transmitting a coherent radiation beam through each of said first, second and third optical fibers, said first, second and third optical fibers defining, respectively, first, second and third optical paths;

(c) applying a bias magnetic field having AC and DC components to immerse each of said magnetic tranducers in said bias magnetic field;
(d) in the absence of said magnetic external field, detecting an optical path length difference between each adjacent pair of said first, second and third optical paths and adjusting said AC and DC components of said bias magnetic field to establish a bias field; and
(e) then, in the presence of said external magnetic field, detecting a total optical path length difference of optical path length differences between each adjacent pair of said first, second and third magnetic transducers to thereby detect said second derivative of said external magnetic field.

18. A method as claimed in claim 17, wherein said external magnetic field is produced by an object on or in a planet, such as earth, and wherein said step d) includes adjusting said AC and DC components to nullify effects of differences in materials utilized for said magnetic transducers and optical fibers and for nullifying effects of said planet's magnetic field and other fields whose measurements are not of interest.

19. A method as claimed in claim 18, wherein step e) includes:
(i) coupling said first and second optical fibers to a fourth optical fiber,
(ii) coupling said second and third optical fibers to a fifth optical fiber,
(iii) coupling said fourth and fifth optical fibers to sixth and seventh optical fibers, and
(iv) directing radiation from said sixth and seventh optical fibers onto a detector to produce an electrical signal indicative of said second derivative of said external magnetic field.

20. A method as claimed in claim 19, wherein steps (e)(i) and (e)(ii) includes:
dividing said second optical fiber into a first and second branch,
coupling said first branch and said first optical fiber to said fourth optical fiber, and
coupling said second branch and said third optical fiber to said fifth optical fiber.

21. A method of detecting a gradient of an external magnetic field as claimed in claim 17, wherein step (b) includes energizing a single mode laser source to generate a single mode coherent radiation beam.

22. A method of detecting a gradient of an external magnetic field as claimed in claim 20, wherein optical fibers for said first through seventh optical fibers and for said first and second branches.

* * * * *